United States Patent
Um et al.

(10) Patent No.: US 12,244,272 B2
(45) Date of Patent: Mar. 4, 2025

(54) NONLINEARITY MANAGEMENT IN LNA BYPASS MODE

(71) Applicant: pSemi Corporation, San Diego, CA (US)

(72) Inventors: Youngman Um, Austin, TX (US); Xiaoling Guo, Austin, TX (US)

(73) Assignee: PSEMI CORPORATION, San Diego, CA (US)

( * ) Notice: Subject to any disclaimer, the term of this patent is extended or adjusted under 35 U.S.C. 154(b) by 515 days.

(21) Appl. No.: 17/549,820

(22) Filed: Dec. 13, 2021

(65) Prior Publication Data

US 2023/0188099 A1 Jun. 15, 2023

(51) Int. Cl.
*H03F 3/19* (2006.01)
*H03F 1/56* (2006.01)

(52) U.S. Cl.
CPC ............... *H03F 3/19* (2013.01); *H03F 1/56* (2013.01); *H03F 2200/294* (2013.01); *H03F 2200/387* (2013.01); *H03F 2200/451* (2013.01)

(58) Field of Classification Search
CPC ........... H03F 3/19; H03F 1/56; H03F 2200/29
See application file for complete search history.

(56) References Cited

U.S. PATENT DOCUMENTS

| | | |
|---|---|---|
| 9,941,849 B1 | 4/2018 | Ayranci et al. |
| 10,038,418 B1 | 7/2018 | Ayranci et al. |
| 2002/0053947 A1* | 5/2002 | Macedo ............... H03F 1/565 |
| | | 330/151 |
| 2004/0207471 A1* | 10/2004 | Raja .................. H03F 1/223 |
| | | 330/285 |
| 2017/0272059 A1 | 9/2017 | Chen et al. |
| 2018/0062231 A1* | 3/2018 | Cebi ................ H04B 1/401 |
| 2018/0062599 A1 | 3/2018 | Lee et al. |
| 2020/0014332 A1* | 1/2020 | Hageraats ........... H03G 3/30 |
| 2020/0328724 A1 | 10/2020 | Ayranci et al. |
| 2022/0393650 A1* | 12/2022 | Ayranci ............. H03F 1/223 |

FOREIGN PATENT DOCUMENTS

| | | |
|---|---|---|
| KR | 20150096193 A | 8/2015 |
| KR | 20190047709 A | 5/2019 |
| KR | 20190113629 A | 10/2019 |

OTHER PUBLICATIONS

International Search Report and Written Opinion for International Application No. PCT/US2022/080425 filed on Nov. 23, 2022 on behalf of PSEMI Corporation Mail Date: Apr. 7, 2023 10 pages.

* cited by examiner

*Primary Examiner* — Patricia T Nguyen
(74) *Attorney, Agent, or Firm* — Steinfl + Bruno LLP

(57) ABSTRACT

Methods and devices to improve nonlinearity performance of low noise amplifiers (LNAs) are disclosed. The described methods and devices reduce the capacitive loading of the LNA amplifying devices on the bypass path of the LNAs when operating in the bypass mode. This is performed by decoupling the active devices from ground to put the amplifying devices in a floating state, thus minimizing the impact of the gate-source capacitances of the amplifying devices on the overall linear performance of the LNA operating in the bypass mode.

16 Claims, 7 Drawing Sheets

| Gain Mode | Switch S1 |
|---|---|
| High Gain | OFF |
| Low Gain | ON |
| Bypass | ON |

| Gain Mode | Switch S1 | Switch S2 |
|---|---|---|
| High Gain | OFF | ON |
| Low Gain | ON | OFF |
| Bypass | OFF | OFF |

| Gain Mode | Switch S1 | Switch S3 | Switch S3' |
|---|---|---|---|
| High Gain | OFF | ON | ON |
| Low Gain, first gain | ON | OFF | ON |
| Low Gain, second gain | ON | ON | OFF |
| Bypass | NA | OFF | OFF |

NONLINEARITY MANAGEMENT IN LNA BYPASS MODE

BACKGROUND

(1) Technical Field

The present disclosure is related to low noise amplifiers (LNAs), more in particular to methods and devices to improve non-linearity performance of LNAs supporting the bypass mode.

(2) Background

In addition to higher and lower gain active modes, LNAs are often required to support the bypass mode, also called as the passive mode. In such a mode, the signal path includes mainly passive devices and/or switches and the signal does not go through amplification. When in such bypass mode, higher linearity performance and lower insertion loss are still required.

FIG. 1 shows a prior art multi-input LNA (100) including amplifying elements (A1, A2), input terminals (IN1, IN2), output terminal (OUT) and bypass circuit (101). Due to strict space limitations on the die, the active and the bypass paths share the same input and output. As a result, the bypass mode is negatively impacted by, for example, capacitive loading of the active devices disposed in the active gain mode path. This means the performance of the LNA when in bypass mode will suffer. The same issue can happen in LNAs with single inputs and this generates design challenges for RF receiver front-ends that include LNAs.

In order to overcome the above-mentioned problem, there exist solutions implementing an input switch in the input signal path used to switch out the active elements from the bypass path when operating in the bypass mode. Such solutions come at the expense of a highly undesired degradation of the noise-figure (NF). An example for such NF degradation is 0.3 dB which is unacceptable in most applications implementing LNAs.

SUMMARY

The disclosed methods and devices address the above-mentioned problems, and provide solutions to the described design challenges.

According to a first aspect of the present disclosure, a low noise amplifier (LNA) is disclosed, the LNA comprising an amplifying element arranged in a common-source configuration, wherein: the low noise amplifier is configured to operate selectively, in one of a high gain, a low gain, or a bypass mode, and in the bypass mode, the amplifying element is decoupled from ground.

According to a second aspect of the present disclosure, a method of reducing a capacitive loading of an amplifying element on a bypass path of a low noise amplifier (LNA) is disclosed, the method comprising: operating the LNA in a bypass mode, and decoupling the amplifying element from ground, thus improving an input third order intercept point (IIP3) or a nonlinearity in the bypass mode.

The details of one or more embodiments of the present disclosure are set forth in the accompanying drawings and the description below. Other features, objects, and advantages of the invention will be apparent from the description and drawings, and from the claims.

DESCRIPTION OF THE DRAWINGS

FIG. 3 shows a table summarizing the state of a switch in the LNA of FIG. 2.
FIG. 5 shows an exemplary table summarizing the states of switches and transistors according to an embodiment of the present disclosure.
FIG. 7 shows an exemplary table summarizing the states of switches and transistors according to an embodiment of the present disclosure.

Like reference numbers and designations in the various drawings indicate like elements.

DETAILED DESCRIPTION

Figure 1:
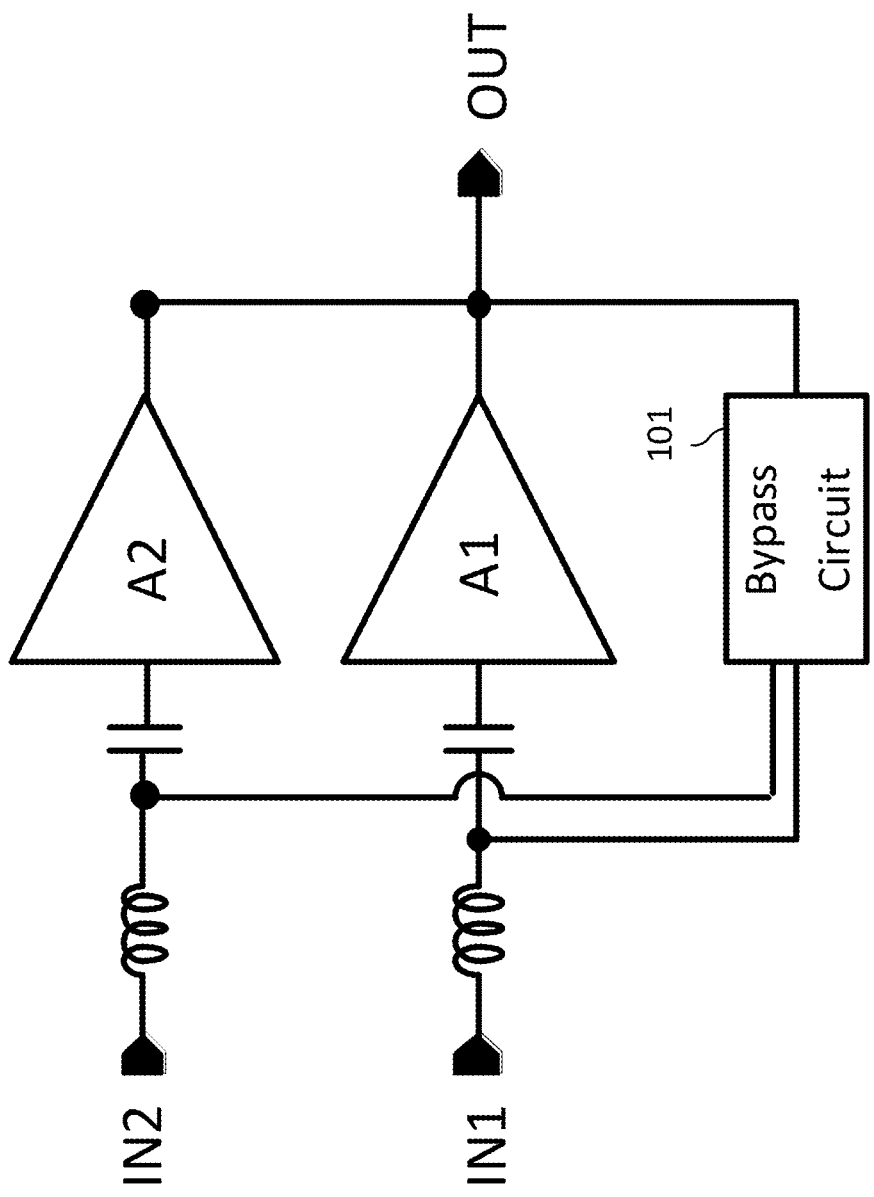
FIG. 1 shows a prior art LNA with multiple inputs.
Figure 2:
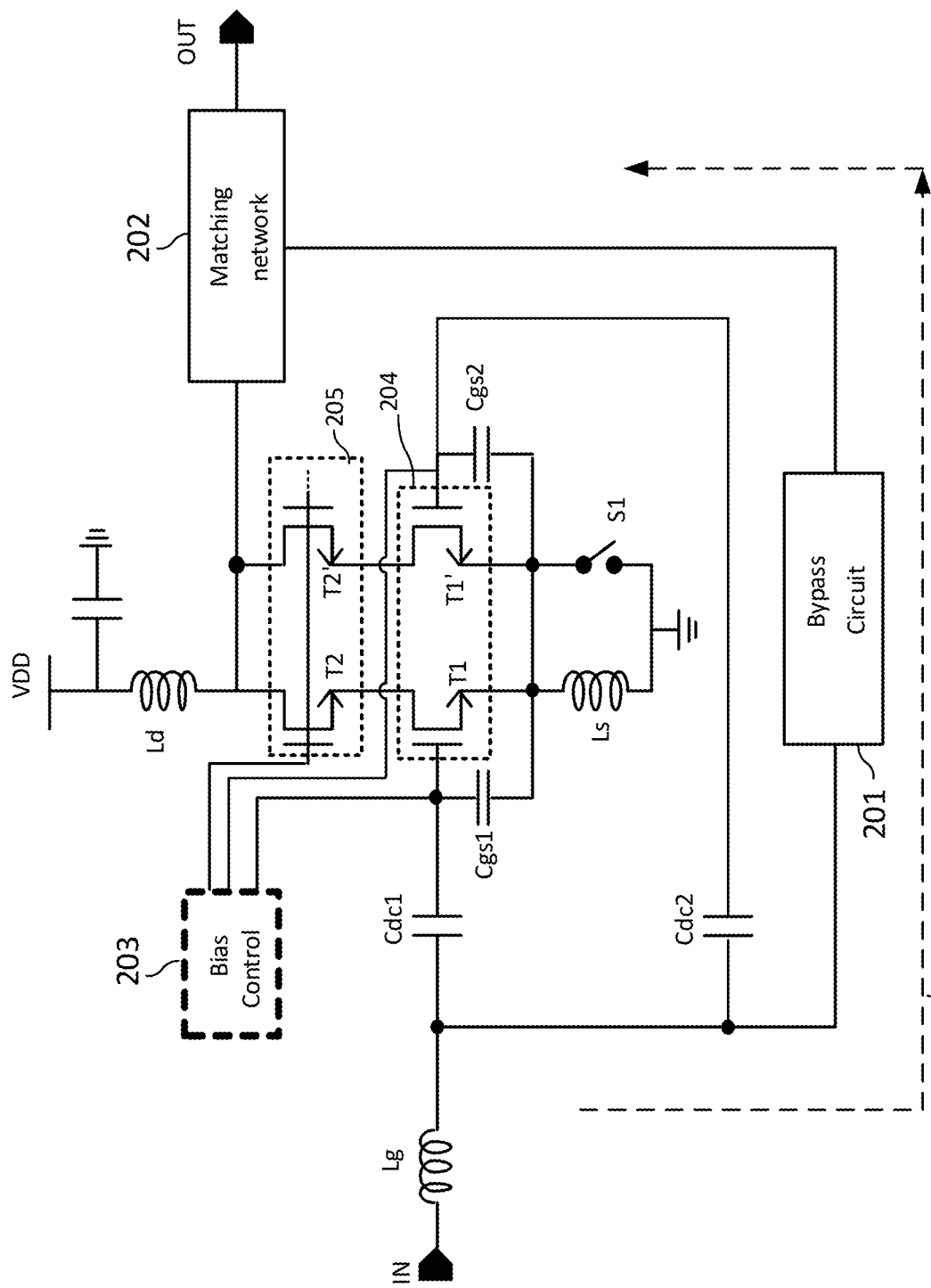
FIG. 2 shows a single-input LNA.

FIG. 2 shows a single-input LNA (200) supporting both active and bypass modes. LNA (200) includes amplifying element (204) comprising amplifying transistors (T1, T1'), and cascode element (205) comprising cascode transistors (T2, T2'). Transistors (T1, T1') are arranged in common-source (CS) configuration. A combination of transistors (T1, T2) forms a first signal path in the active mode, such signal path being called a first branch throughout the disclosure. Similarly, a second signal path in the active mode is formed based on a combination of transistors (T1', T2'), the second signal path being called second branch through the present disclosure. When in the active mode, depending on the selected gain mode, both the first and the second branch or either of them can be active. In other words, when in higher gain mode, both the first and the second branch are active, and when in the lower gain mode, either of the branches may be active depending on the desired lower gain. Bias control circuit (203) provides separate required bias voltages/currents to transistors (T1, T1', T2, T2') and also provides the branch selection/control functionality. The pair of transistors (T1, T2) can have different sizes compared to the pair of transistors (T1', T2') and such sizes can be selected as a function of the different desired gains in the low gain mode where only one of the branches is active and the other one is inactive.

With continued reference to FIG. 2, when in bypass mode, the first and the second branches are inactive. As also shown, the signal path in such bypass mode is indicated by bypass path (210). LNA (200) further comprises bypass circuit (201) disposed in bypass path (210). Bypass circuit (201) typically includes switches and passive devices. Also shown in FIG. 2, are direct current (DC) decoupling capacitors (Cdc1, Cdc2), and matching network (202) matching the output of the circuit to the rest of the receiver circuits (not shown) downstream from output terminal (OUT). Inductor (Lg) couples input terminal (IN) to amplifying element (204) and inductor (Ld) couples bias voltage (VDD) to cascode element (205). LNA (200) further includes switch (S1) coupled across degeneration inductor (Ls).

FIG. 3 shows table (300) summarizing the state of switch (S1) of FIG. 2 with respect to different gain modes. As can be seen, switch (S1) is in the OFF state (open) when in the high gain mode, in the ON state (closed) in the low gain mode, and also in the ON state (closed) when operating in bypass mode. It is known that when in bypass mode, shorting/coupling the amplifying element (204) to ground as performed by closing switch (S1) is a potential root cause of non-linear performance degradation. As an example, as a result of such coupling to ground, the input third order intercept point (IIP3) may suffer by, for example, by up to 5 dB. This is due to the non-linear gate-source capacitive loading effect (Cgs1 and/or Cgs2) by off-state CS amplifying element (204) at the input of the bypass path (210). This poses an additional design challenge when implementing LNAs with bypass mode.

Figure 4:
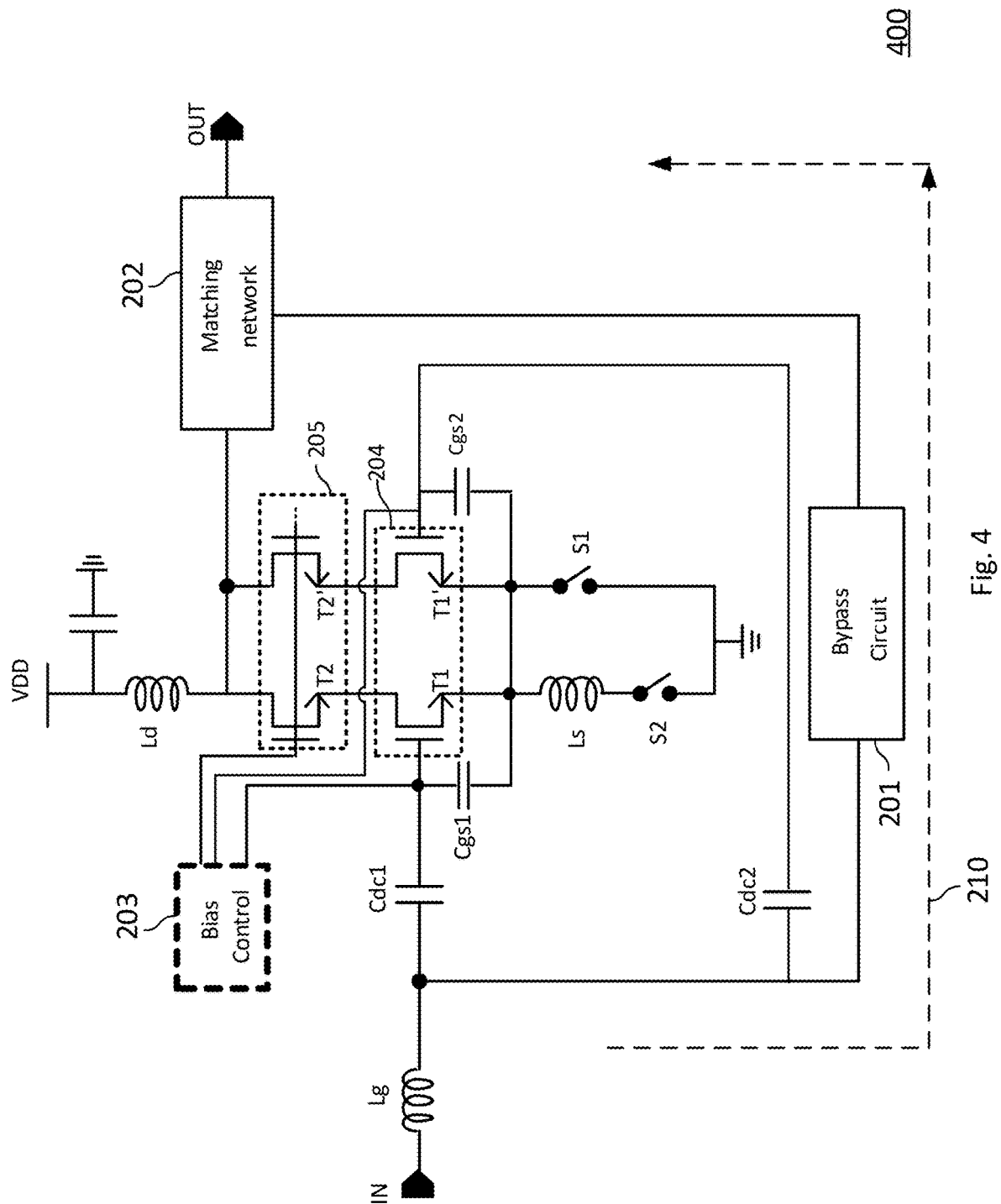
FIG. 4 shows an exemplary LNA according to an embodiment of the present disclosure.

FIG. 4 shows an exemplary LNA (400) according to an embodiment of the present disclosure. The principle of operation of LNA (400) is similar to what was described with regards to LNA (200) of FIG. 2, except that LNA (400) of FIG. 4 further comprises additional switch (S2) arranged in series with inductor (Ls). According to the teachings of the present disclosure, when LNA (400) is operating in the bypass mode, amplifying element (204) including transistors (T1, T1') can be decoupled from ground, thereby minimizing the undesired non-linear capacitive loading of gate-source capacitors (Cgs1, Cgs2) on the bypass path (210). This is performed by opening switch (S2), i.e. putting switch (S2) in the OFF state, when operating in bypass mode. As a result, transistors (T1, T1') will be in a floating state and decoupled from ground. According to an embodiment of the present disclosure, by virtue of the above-disclosed teachings, the non-linear performance, e.g. IIP3, of LNA (400) can see improvements of around 4 to 5 dB over the LNA (200) of FIG. 2, while operating in the bypass mode.

FIG. 5 represents an exemplary table (500) summarizing the states of switches (S1, S2) of FIG. 4 in different gain modes in accordance with an embodiment of the present disclosure. As can be seen, both switches (S1, S2) are in OFF state (open) during the bypass mode for the reasons disclosed above. Switch (S2) is in ON state (closed) only when the LNA of FIG. 4 operates in high gain mode, in order to switch in degeneration inductor (Ls). On the other hand, during the low gain mode, switch (S1) is in ON state (closed). With reference to FIG. 4, the addition of switch (S2) has substantially no impact on the overall performance of LNA (400) when operating in either high or low gain mode. More in particular, as switch (S2) is not disposed in the signal path, the resulting impact on the NF in both gain modes is negligible.

Figure 6:
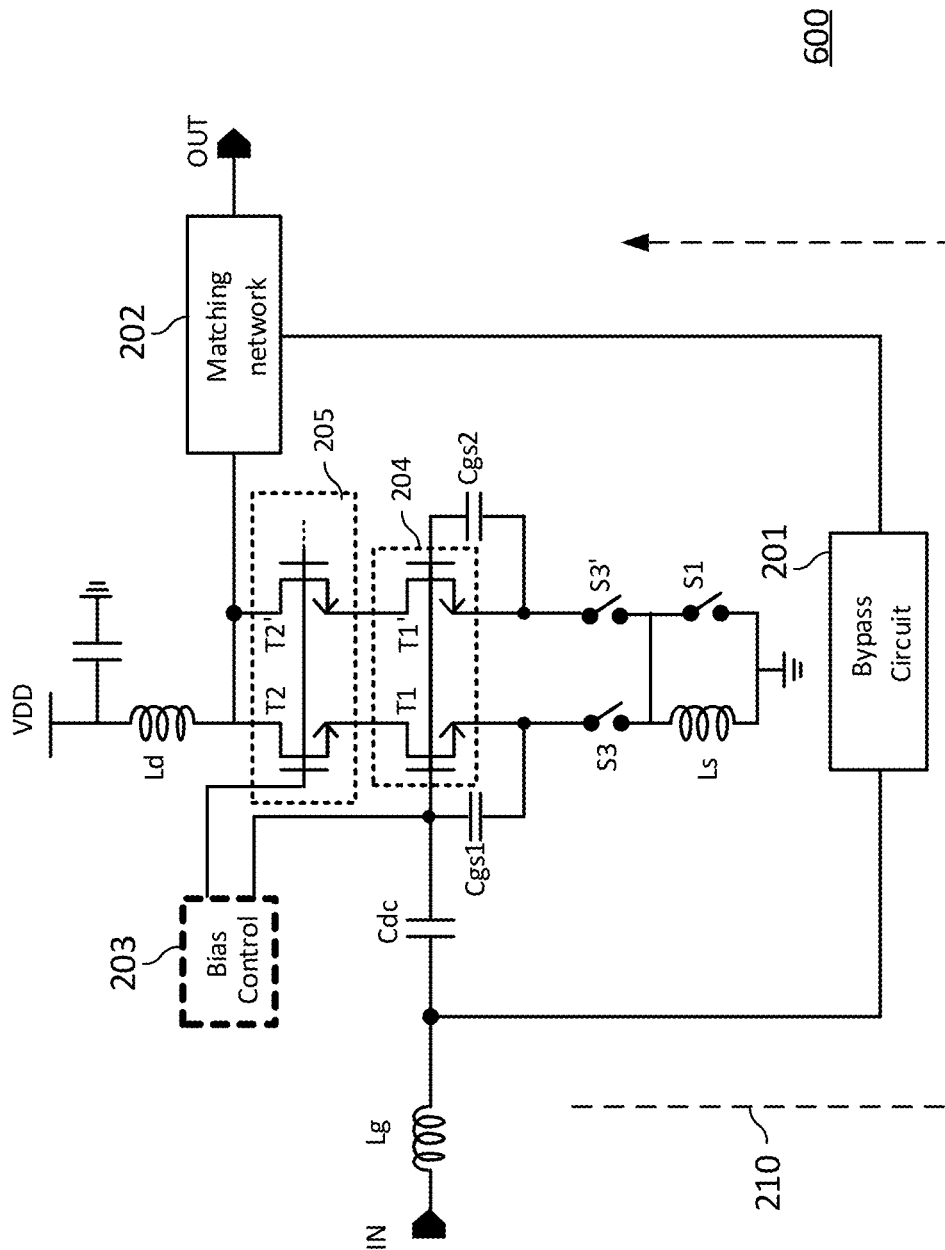
FIG. 6 shows an exemplary LNA according to an embodiment of the present disclosure.

FIG. 6 shows an exemplary LNA (600) according to an embodiment of the present disclosure. The principle of operation of LNA (600) is similar to what was described with regards to LNA (400) of FIG. 4, except that LNA (600) of FIG. 6 further comprises additional switches (S3, S3') instead of switch (S2) of FIG. 4. Switches (S3, S3') are arranged serially with respective transistors (T1, T1'). According to the teachings of the present disclosure, both switches (S3, S3') are in OFF state (open) when LNA (600) is operating in the bypass mode. As a result, transistors (T1, T1') are decoupled from ground in bypass mode, resulting in similar non-linear performance improvements as described with regards to LNA (400) of FIG. 4.

FIG. 7 shows an exemplary table (700) summarizing the states of switches (S1, S3, S3') of FIG. 6 in different gain modes in accordance with an embodiment of the present disclosure. As mentioned before, in the bypass mode, switches (S3, S3') are both open to ensure transistors (T1, T1') are in a floating state, decoupled from ground to minimize non-linear capacitive loading of gate-source capacitors (Cgs1, Cgs2) on the bypass path (210). Switch (S1) can be in any state (NA) during the bypass mode. In the high gain mode, switch (S1) is in OFF state (open) and switches (S3, S3') are in ON state (closed). In the low gain mode, switch (S1) is in ON state (closed) (thereby bypassing degeneration inductor (Ls)), and switches (S3, S3') are in opposite states, where the state of each will depend on the desired gain. As an example, for a first low gain mode, switch (S3) may be in ON state (closed) while switch (S3') is in OFF state (open), and in a second low gain mode, switch (S3') may be in ON state (closed) while switch (S3) is in OFF state (open).

In accordance with various embodiments of the present disclosure, in the low gain mode, the function of selecting which one of the first or the second branch to be active (or inactive) may be performed either through bias control circuit (203) as described before, or else through controlling the states of switches (S3, S3'). For example, when a first low gain is selected, switch (S3) is in OFF state (open) and switch (S3') in ON state (closed) and as a result the second branch, i.e. the one including transistors (T1', T2') is active. On the other hand, when a second low gain is selected, switch (S3') is in OFF state (open) and switch (S3) in ON state (closed) and as a result the first branch, i.e. the one including transistors (T1, T2) is active.

With reference to embodiments of FIGS. 4 and 6, the person skilled in the art will understand that LNAs (400, 600) have an exemplary structure to illustrate the disclosed teachings. However, other LNAs with different structures and having amplifying elements arranged in CS configuration may also be used. Moreover, amplifying element (204) and cascode elements (205) include each a pair of transistors, however, elements including only one or multiple transistors may also be envisaged when implementing the disclosed teachings. In an embodiment, any of the transistors (T1, T1', T2, T2') may comprise a MOSFET. In another embodiment, switches (S1, S2, S3, S3') are controlled by a control circuit.

The disclosed teachings can be applied to LNAs implemented as part of a communication modules, communication systems, RF integrated circuits, RF receiver front-ends, and/or a combination thereof.

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms.

Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A low noise amplifier (LNA) comprising
an amplifying element;
a first inductor configured to selectively couple the amplifying element to ground;
a first switch, and
a second switch disposed in series with the first inductor to form a series combination;
wherein:
the first switch is coupled across the series combination of the second switch and the first inductor;
the low noise amplifier is configured to operate selectively in one of a high gain, a low gain, or a bypass mode, and
in the bypass mode, the amplifying element is decoupled from ground.

2. The LNA of claim 1, wherein:
in the low gain mode, the amplifying element is shorted to ground, and
in the high gain mode, the amplifying element is coupled to ground through the first inductor.

3. The LNA of claim 2, wherein:
in the high gain mode, the first switch is in an OFF state, and the second switch is in an ON state, and
in the low gain mode, the first switch is in the ON state, and the second switch is in the OFF state.

4. The LNA of claim 3, wherein the amplifying element comprises a transistor configured to be:
in an active state in the high gain and the low gain modes, and
in an inactive state in the bypass mode.

5. The LNA of claim 4, further comprising a control circuit configured to control selection of the active state and the inactive state of the transistor.

6. The LNA of claim 3, wherein:
the amplifying element comprises a first amplifying transistor and a second amplifying transistor;
in the high gain mode, the first amplifying transistor and the second amplifying transistor are in an active state;
in the low gain mode, based on a selected low gain, either:
  i) the first amplifying transistor is in the active state and the second amplifying transistor is in an inactive state, or
  ii) the second amplifying transistor is in the active state and the first amplifying transistor is in an inactive state, and
in the bypass mode, the first amplifying transistor and the second amplifying transistor are in the inactive state.

7. The LNA of claim 6, further comprising a control circuit configured to control selection of the active state and the inactive state.

8. A low noise amplifier (LNA) comprising:
an amplifying element;
a first switch coupled across a first inductor, and
a second switch and a third switch arranged in a parallel configuration;
wherein
the low noise amplifier is configured to operate selectively in one of a high gain, a low gain, or a bypass mode;

in the low gain mode, the amplifying element is shorted to ground;

in the high gain mode, the amplifying element is coupled to ground through the first inductor;

in the bypass mode, the amplifying element is decoupled from ground, and a combination of the second switch and the third switch couples the amplifying element to the first inductor.

9. The LNA of claim 8, wherein:

the low gain mode comprises a first low gain mode and a second low gain mode;

in the high gain mode, the first switch is in an OFF state, the second switch and the third switch are in an ON state;

in the first low gain mode, the first switch is in the ON state, the second switch is in the ON state, and the third switch is in the OFF state;

in the second low gain mode, the first switch is in the ON state, the second switch is in the OFF state, and the third switch is in the ON state, and in the bypass mode, the second switch and the third switch are in the OFF state.

10. The LNA of claim 9, wherein:

the amplifying element comprises a first amplifying transistor and a second amplifying transistor;

in the high gain mode, the first amplifying transistor and the second amplifying transistor are in an active state;

in the first low gain mode, the first amplifying transistor is in the active state and the second amplifying transistor is in an inactive state;

in the second low gain mode, the first amplifying transistor is in the inactive state and the second amplifying transistor is in the active state, and in the bypass mode, the first amplifying transistor and the second amplifying transistor are in the inactive state.

11. The LNA of claim 4, further comprising a cascode transistor arranged in series with the transistor.

12. The LNA of claim 10, further comprising:

a first cascode transistor arranged in series with the first amplifying transistor, and a second cascode transistor arranged in series with the second amplifying transistor.

13. The LNA of claim 10, further comprising a direct current (DC) decoupling capacitor coupling an input of the LNA to a gate terminal of the first amplifying transistor.

14. A radio frequency (RF) receiver front-end comprising the LNA of claim 1.

15. An integrated circuit comprising the LNA of claim 1.

16. A method of reducing a capacitive loading of an amplifying element on a bypass path of a low noise amplifier (LNA), the bypass path including an inductor, a first switch, and a second switch, the method comprising:

arranging the amplifying element in a common-source configuration;

coupling the amplifying element to ground i) through a series combination of the inductor and the first switch, or ii) through the second switch, the second switch being coupled across a series combination of the first inductor and the first switch;

operating the LNA in a bypass mode, and decoupling, through the first switch and the second switch, the amplifying element from ground, thus improving an input third order intercept point (IIP3) or a nonlinearity in the bypass mode.

* * * * *